United States Patent
Ebihara et al.

(10) Patent No.: US 7,980,444 B2
(45) Date of Patent: Jul. 19, 2011

(54) ELECTRONIC COMPONENT MOUNTING HEAD, AND APPARATUS AND METHOD FOR MOUNTING ELECTRONIC COMPONENT

(75) Inventors: Hiroshi Ebihara, Osaka (JP); Hiroshi Nasu, Osaka (JP); Katsuhiko Watanabe, Osaka (JP); Hiroyuki Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 958 days.

(21) Appl. No.: 11/887,740

(22) PCT Filed: May 8, 2007

(86) PCT No.: PCT/JP2007/059494
§ 371 (c)(1),
(2), (4) Date: Oct. 3, 2007

(87) PCT Pub. No.: WO2007/129700
PCT Pub. Date: Nov. 15, 2007

(65) Prior Publication Data
US 2009/0265924 A1 Oct. 29, 2009

(30) Foreign Application Priority Data

May 9, 2006 (JP) .................................. 2006-129991

(51) Int. Cl.
*B23K 1/06* (2006.01)
*B23K 37/00* (2006.01)
(52) U.S. Cl. ........................................ 228/1.1; 228/49.5
(58) Field of Classification Search .................. None
See application file for complete search history.

(56) References Cited

U.S. PATENT DOCUMENTS

| 4,515,651 | A | * | 5/1985 | MacLaughlin et al. ........ 156/423 |
| 5,250,469 | A | * | 10/1993 | Tanaka et al. .................... 29/840 |
| 5,431,324 | A | | 7/1995 | Kajiwara et al. |
| 6,202,915 | B1 | | 3/2001 | Sato |
| 6,467,670 | B2 | | 10/2002 | Higashi et al. |
| 6,892,927 | B2 | * | 5/2005 | Rumer et al. .............. 228/110.1 |

(Continued)

FOREIGN PATENT DOCUMENTS

CN 1643652 7/2005
(Continued)

OTHER PUBLICATIONS

Patent Cooperation Treaty (PCT) International Preliminary Report on Patentability issued Dec. 24, 2008 in corresponding to International Application No. PCT/JP2007/059494.

(Continued)

*Primary Examiner* — Kiley Stoner
(74) *Attorney, Agent, or Firm* — Wenderoth, Lind & Ponack, L.L.P.

(57) ABSTRACT

An electronic component mounting apparatus includes an electronic component mounting head for holding an electronic component and an up/down device for pressing the electronic component against a circuit board, and the electronic component is pressed against the circuit board while ultrasonic vibrations are applied from an ultrasonic transducer of the electronic component mounting head to the electronic component via a component holding unit, so that the electronic component is mounted onto the circuit board. In the electronic component mounting apparatus, the electronic component is heated via the component holding unit by radiant heat from a heater fixed to the component holding unit in a noncontact state, so that even when the electrothermal heater is replaceably attached, characteristics of the ultrasonic vibrations applied to the electronic component can be maintained constant.

16 Claims, 7 Drawing Sheets

U.S. PATENT DOCUMENTS

| | | |
|---|---|---|
| 2003/0150108 A1 | 8/2003 | Higashi et al. |
| 2005/0227429 A1 | 10/2005 | Minamitani et al. |
| 2005/0268457 A1 | 12/2005 | Ebihara et al. |
| 2010/0250615 A1* | 9/2010 | Reghetti et al. ............... 707/802 |

FOREIGN PATENT DOCUMENTS

| | | |
|---|---|---|
| JP | 5-206224 | 8/1993 |
| JP | 11-284028 | 10/1999 |
| JP | 2000-68327 | 3/2000 |
| JP | 2000-77486 | 3/2000 |
| JP | 2000-91385 | 3/2000 |
| JP | 2000-228426 | 8/2000 |
| JP | 2002-76590 | 3/2002 |
| JP | 2002-118152 | 4/2002 |
| JP | 2002-184810 | 6/2002 |
| JP | 2003-258037 | 9/2003 |
| JP | 2003-282644 | 10/2003 |
| JP | 2004-95810 | 3/2004 |
| JP | 2005-322770 | 11/2005 |
| JP | 2005-347506 | 12/2005 |
| WO | 03/081644 | 10/2003 |

OTHER PUBLICATIONS

International Search Report issued Jun. 5, 2007 in the International (PCT) Application of which the present application is the U.S. National Stage.

* cited by examiner

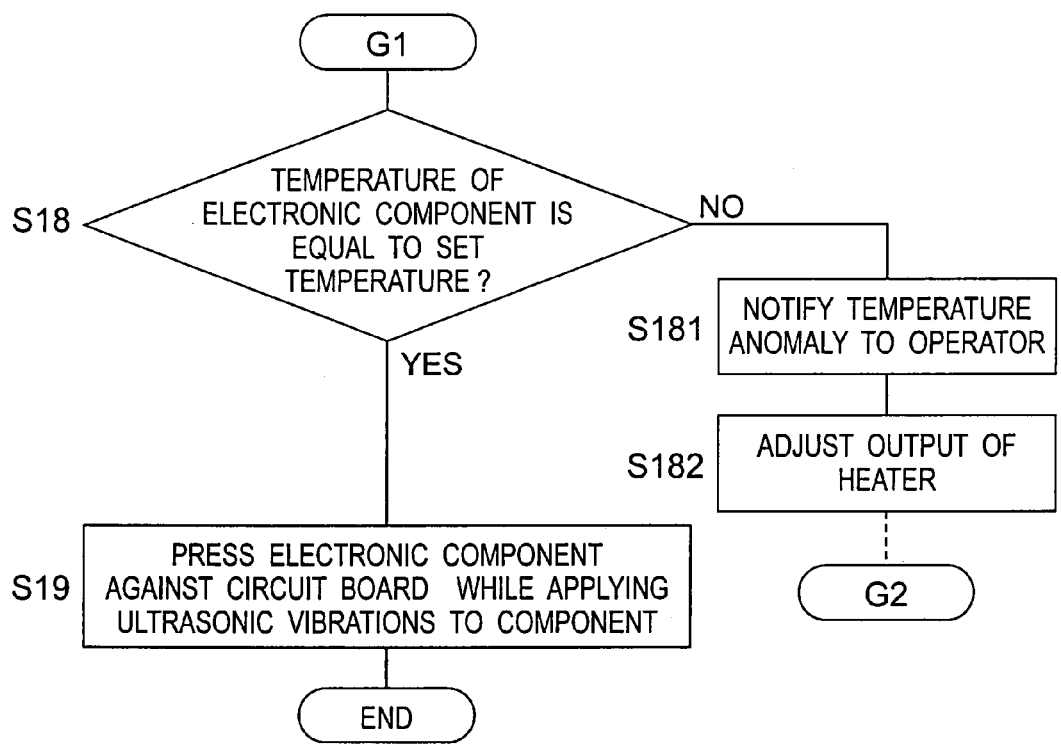

ELECTRONIC COMPONENT MOUNTING HEAD, AND APPARATUS AND METHOD FOR MOUNTING ELECTRONIC COMPONENT

BACKGROUND OF THE INVENTION (1) Field of the Invention

The present invention relates to a technology for mounting electronic components onto a circuit board with use of ultrasonic waves.

(2) Description of Related Art

In apparatuses for mounting electronic components on circuit boards such as printed circuit boards, various methods are conventionally used for bonding the electrodes of electronic components and the electrodes of the circuit boards, among which a bonding method (hereinafter, referred to as "ultrasonic bonding") of using ultrasonic waves is known as one of the methods that allow electronic components to be mounted in short time and at relatively low temperatures. In ultrasonic bonding, electronic components pressed against a circuit board are vibrated by ultrasonic vibrations so that the electrodes (for example, bumps are formed) of the electronic components and the electrodes of the circuit board are electrically bonded.

In the apparatus for mounting electronic components which performs such ultrasonic bonding, the bonding strength is increased to enhance the quality of mounting by heating the electrodes of the electronic components or the circuit board concurrently while applying ultrasonic vibrations to the electronic components. Such heating is usually performed by heating the circuit board from one side opposite to the side from which the electronic components are to be mounted.

Since it is not desirable to heat the entire circuit board to high temperature, a technology for heating semiconductor chips during mounting process to enhance the bonding strength is disclosed in Patent Document 1 for example. In Patent Document 1, a laser absorber provided on a bonding head is heated by applying a laser beam thereto, and the heat from the laser absorber is transferred to a semiconductor chip sucked and held by the bonding head via a heat conduction plate.

Patent Document 1: Japanese unexamined patent publication No. 2003-258037

BRIEF SUMMARY OF THE INVENTION

In the apparatus of Patent Document 1, a laser oscillator and an optical fiber for guiding a laser beam to a bonding head is provided on the outside of the bonding head, while various components such as a mirror for guiding a laser beam, a laser absorber and a heat conduction plate are provided in the inside of the bonding head. As a result, the bonding head and the apparatus are complicated in structure, which leads to increases in apparatus cost.

From a viewpoint of simplifying the structure of the apparatus, it is considered desirable to provide, for example, an electrothermal heater as a heating unit in a component holding unit for holding electronic components so that the component holding unit and the electronic components are heated through heat conduction. However, the life of the heating unit typified by the heater is relatively short, and therefore if the heater is fixed to the component holding unit in an irreplaceable manner, it becomes impossible to use the component holding unit for prolonged time periods. On the contrary, when the heater is replaceably attached, characteristics of ultrasonic vibrations applied to electronic components via the component holding unit may be changed by such causes as slight displacement of the attachment position and slight mass difference of the heater due to replacement of the heater, leading to a possibility that a desired bonding strength could no longer be obtained.

Accordingly, an object of the present invention is to solve these and other issues described above and provide electronic component mounting apparatus and method in which in fulfillment of the ultrasonic bonding of electronic components onto a circuit board while heating the electronic components, mounting of the electronic components can be achieved while characteristics of ultrasonic vibrations applied to the electronic components are maintained constant even with replacement of an electrothermal heater.

In order to accomplish the above object, the present invention is constituted as follows.

According to a first aspect of the present invention, there is provided an electronic component mounting apparatus for mounting an electronic component onto a circuit board using an ultrasonic wave, comprising:

a component holding unit for holding the electronic component;

a supporter to which the component holding unit is attached;

a heating unit, which is fixed to the supporter in non-contact state with the component holding unit, for applying radiant heat so as to heat the electronic component in a state of being held by the component holding unit;

an ultrasonic transducer for applying ultrasonic vibrations to the electronic component via the component holding unit; and a pressing device for pressing the electronic component toward the circuit board via the supporter and the component holding unit.

According to a second aspect of the present invention, there is provided the electronic component mounting apparatus according to the first aspect, wherein the component holding unit has a hole portion into which the heating unit is inserted, and the heating unit in a state of being inserted in the hole portion without coming into contact with an inner surface of the hole portion is held by the supporter.

According to a third aspect of the present invention, there is provided the electronic component mounting apparatus according to the second aspect, wherein the hole portion is a through hole formed in a direction perpendicular to a direction of vibrations of the component holding unit by the ultrasonic transducer, and the heating unit is held by the supporter from both sides of the through hole.

According to a fourth aspect of the present invention, there is provided the electronic component mounting apparatus according to the second aspect, wherein the component holding unit comprises:

a vibration transmitting member having the hole portion formed therein, which is placed so as to extend in parallel to the direction of vibrations of the component holding unit by the ultrasonic transducer; and a holding tool, which is attached to one end of the vibration transmitting member, for holding the electronic component, wherein in the vibration transmitting member, a central axis of the hole portion is placed so as to perpendicularly intersect a central axis of the vibration transmitting member, and the hole portion is placed so as to be in plane symmetry with a plane including the central axis of the hole portion and the central axis of the vibration transmitting member.

According to a fifth aspect of the present invention, there is provided the electronic component mounting apparatus according to the second aspect, wherein the heating unit is an electrothermal heater, and a gap of not less than 7.5 µm and not more than 100 µm is provided between a surface of the heater and an inner surface of the hole portion.

According to a sixth aspect of the present invention, there is provided the electronic component mounting apparatus according to the second aspect, wherein the component holding unit comprises:

a vibration transmitting member in which the hole portion is formed, the heating unit being inserted in the hole portion, and in which the ultrasonic transducer is attached at one end portion of the vibration transmitting member, the vibration transmitting member being placed so as to extend in parallel to a direction of vibrations of the component holding unit by the ultrasonic transducer; and a holding tool, which is attached to the other end of the vibration transmitting member, for holding the electronic component, wherein in the vibration transmitting member, the hole portion is placed in a proximity to the other end of the vibration transmitting member while the heating unit is placed in a proximity of the other end of the vibration transmitting member.

According to a seventh aspect of the present invention, there is provided the electronic component mounting apparatus according to the first aspect, wherein the supporter supports the component holding unit only at a nodal portion of vibrations of the component holding unit by the ultrasonic transducer.

According to an eighth aspect of the present invention, there is provided the electronic component mounting apparatus according to the first aspect, further comprising a thermometer for measuring temperature of the component holding unit or temperature of an electronic component held by the component holding unit in non-contact state with the component holding unit.

According to a ninth aspect of the present invention, there is provided the electronic component mounting apparatus according to the first aspect, further comprising a thermocouple, which is inserted into a hole portion formed in the component holding unit, for measuring temperature of the component holding unit in non-contact with the component holding unit.

According to a tenth aspect of the present invention, there is provided an electronic component mounting head for use in an electronic component mounting apparatus for mounting an electronic component onto a circuit board with use of an ultrasonic wave, comprising:

a component holding unit for holding the electronic component;

a supporter to which the component holding unit is attached;

a heating unit, which is fixed to the supporter in non-contact state with the component holding unit, for applying radiant heat so as to heat the electronic component in a state of being held by the component holding unit; and an ultrasonic transducer for applying ultrasonic vibrations to the electronic component via the component holding unit.

According to an eleventh aspect of the present invention, there is provided an electronic component mounting method for mounting an electronic component onto a circuit board with use of an ultrasonic wave, comprising:

giving radiant heat from the heating unit fixed to the supporter in non-contact state with the component holding unit so that the electronic component is heated via the component holding unit; and concurrently pressing the electronic component toward the circuit board while applying ultrasonic vibrations to the electronic component via the component holding unit to mount the electronic component onto the circuit board.

According to the present invention, in the operation that electronic components are ultrasonically bonded onto a circuit board while being heated, characteristics of ultrasonic vibrations applied to the electronic components can be maintained constant even with replacement of the heating unit (e.g., electrothermal heater). That is, the present invention adopts a structure in which the heating unit for heating electronic components with radiant heat applied is supported by a supporter in non-contact with the component holding unit that transmits to the electronic components the ultrasonic vibrations transmitted from an ultrasonic transducer. Adopting such structure makes it possible to achieve the support of the heating unit by the supporter (i.e., replaceable support) and the transmission of ultrasonic vibrations by the component holding unit in such a way that the support and the transmission do not affect each other with a non-contact relation. Therefore, characteristics of the ultrasonic vibrations applied to the electronic components can be stabilized, which can ensure a reliable mounting of electronic components onto the circuit board through ultrasonic bonding.

BRIEF DESCRIPTION OF THE DRAWINGS

These and other aspects and features of the present invention will become clear from the following description taken in conjunction with the preferred embodiments thereof with reference to the accompanying drawings, in which:

FIG. 5B is a flowchart showing the flow of mounting of electronic components;

DETAILED DESCRIPTION OF THE INVENTION

Figure 1:
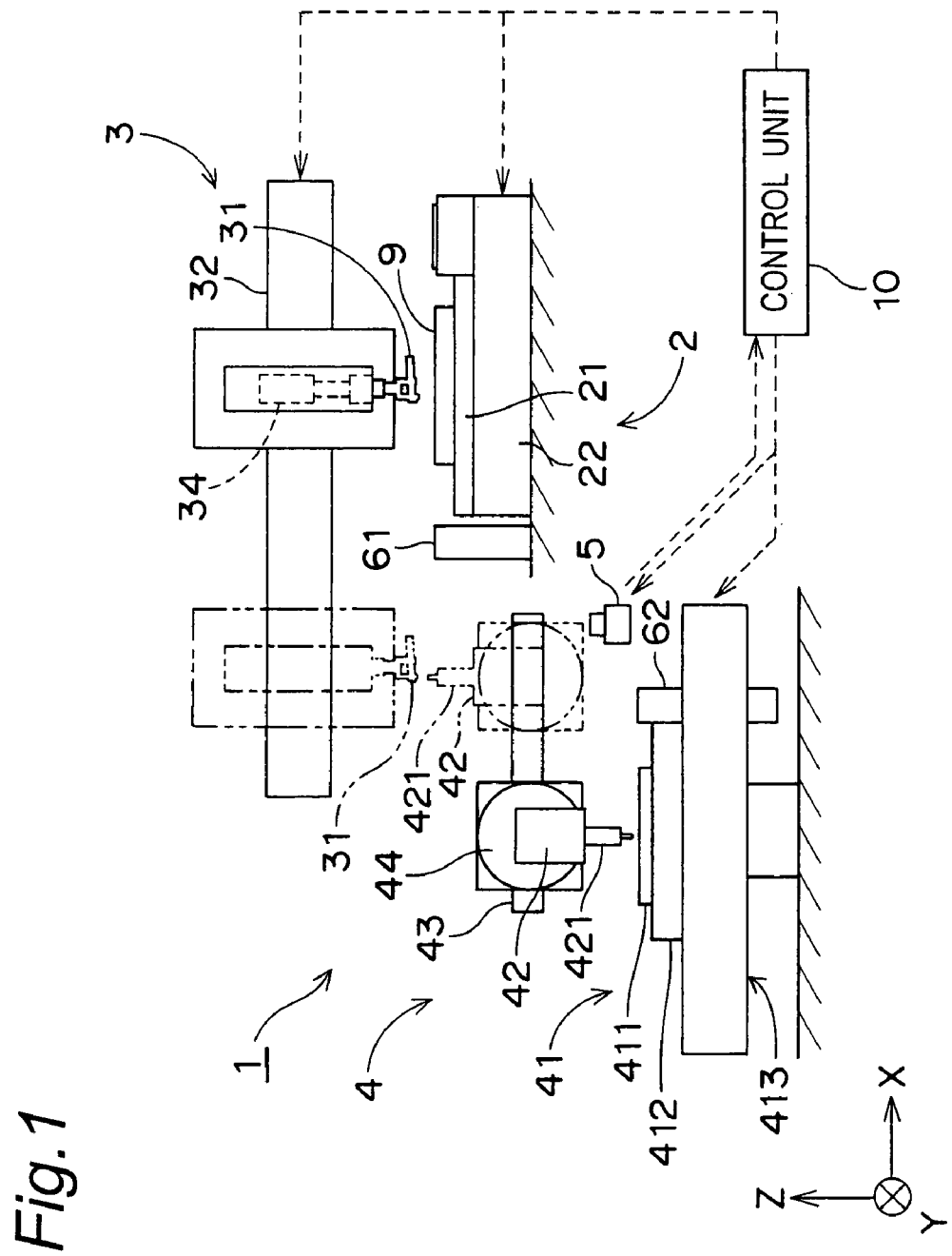
FIG. 1 is a front view of an electronic component mounting apparatus according to a first embodiment of the present invention.

Before the description of the present invention proceeds, it is to be noted that like parts are designated by like reference numerals throughout the accompanying drawings. Hereinbelow, an embodiment of the present invention will be described in detail with reference to the accompanying drawings.

First Embodiment

Figure 2:
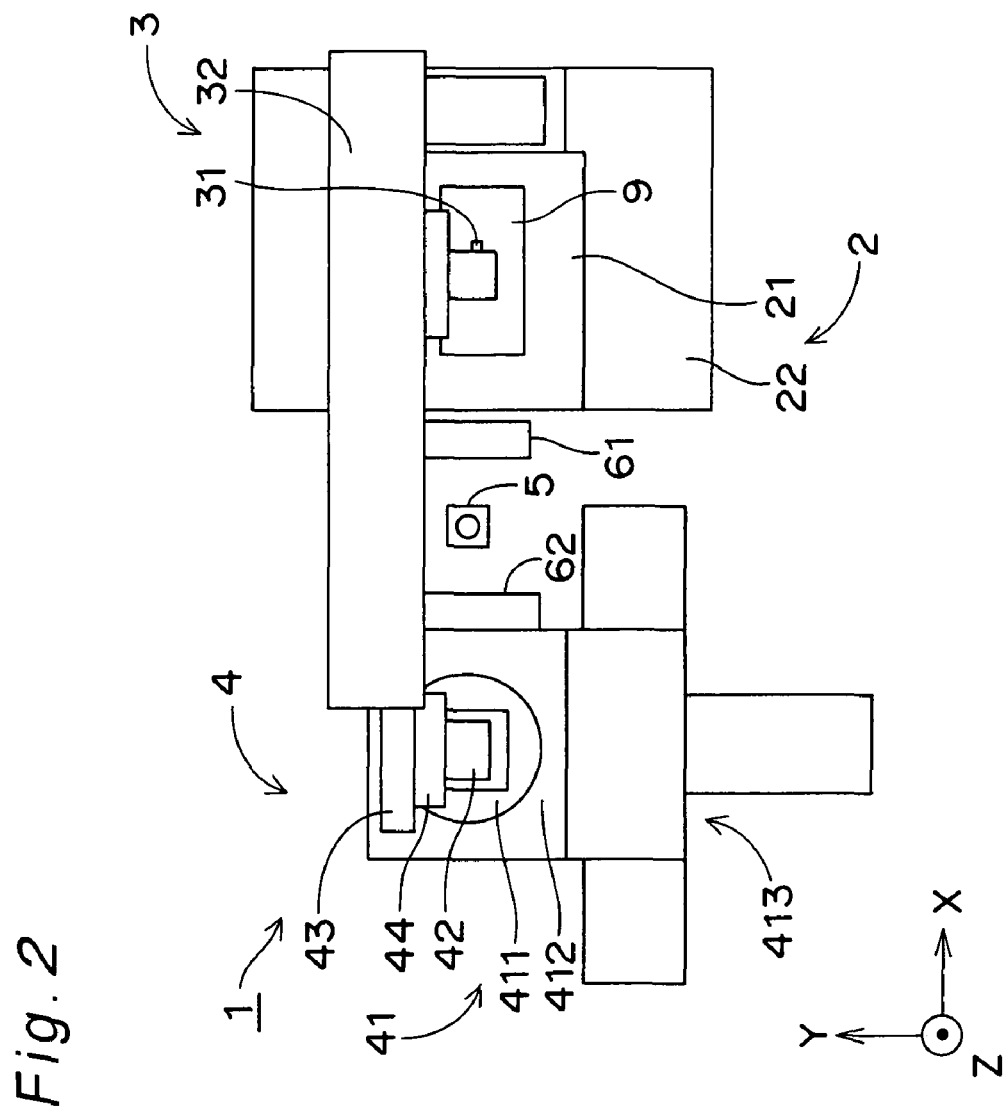
FIG. 2 is a plan view of the electronic component mounting apparatus.

FIG. 1 is a front view showing the structure of an electronic component mounting apparatus 1 according to a first embodiment of the present invention, and FIG. 2 is a plan view of the electronic component mounting apparatus 1. The electronic component mounting apparatus 1 is a so-called flip chip mounting apparatus which, after reversal of a fine electronic component, mounts the electronic component onto a circuit board 9 such as a printed circuit board using an ultrasonic wave while performing the bonding of electrodes, concurrently (that is, performed the mounting of electronic components).

As shown in FIGS. 1 and 2, the electronic component mounting apparatus 1 has a board holding unit 2 for holding the circuit board 9, and on the (+Z) side of the board holding unit 2, a mounting device 3 for mounting electronic components onto the circuit board 9 held by the board holding unit 2 is provided. Moreover, a component feed unit 4 for feeding electronic components to the mounting device 3 is provided on the (−X) side of the board holding unit 2. Provided between the board holding unit 2 and the component feed unit 4 are an image pickup unit 5 for picking up images of electronic components fed to the mounting device 3 by the component feed unit 4, and component collecting devices 61, 62 for collecting electronic components. In the electronic component mounting apparatus 1, these devices are controlled by a control unit 10 shown in FIG. 1, by which the electronic components are mounted onto the circuit board 9.

The board holding unit 2 has a stage 21 for holding the circuit board 9 and a stage moving device 22 which moves the stage 21 in a direction Y in FIGS. 1 and 2. The mounting device 3 is composed of an electronic component mounting head 31, a mounting head moving device 32 for moving the electronic component mounting head 31 in a direction X, and an up/down device 34 (see FIG. 1) for moving the electronic component mounting head 31 in a direction Z (i.e., lifting and lowering). It is to be noted that in the first embodiment, the direction X and the direction Y are directions perpendicular to each other within a horizontal plane, and the direction Z is a direction perpendicular to the direction X and the direction Y, i.e., a vertical direction. Moreover, the "+" direction in the directions X, Y and Z is a direction shown by an arrow in the drawings while the "−" direction is a direction opposite to the arrow direction.

Figure 3:
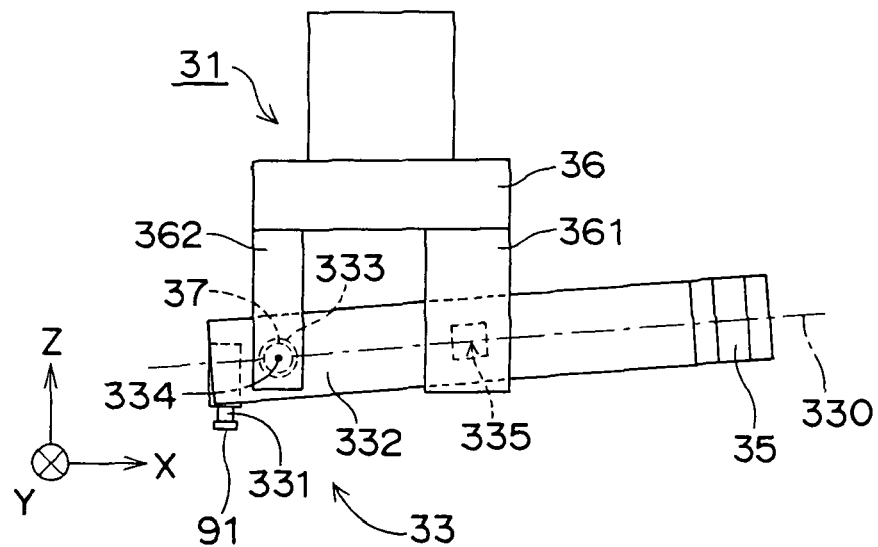
FIG. 3 is an enlarged front view showing an electronic component mounting head.
Figure 4:
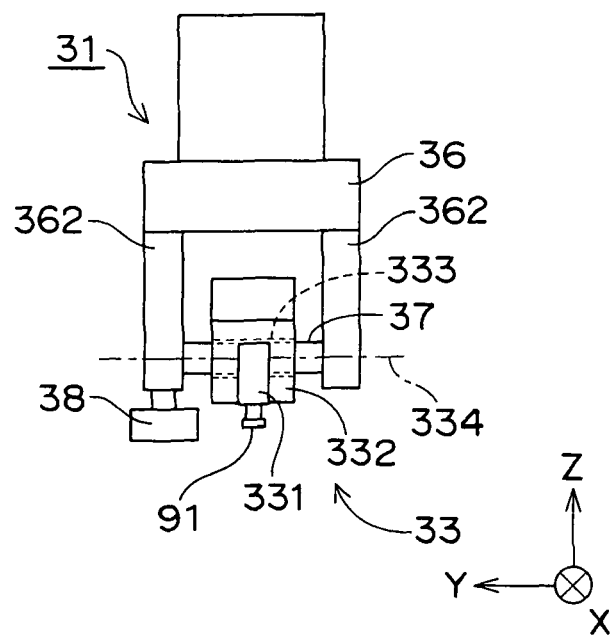
FIG. 4 is an enlarged left side view showing the electronic component mounting head.
Figure 8:
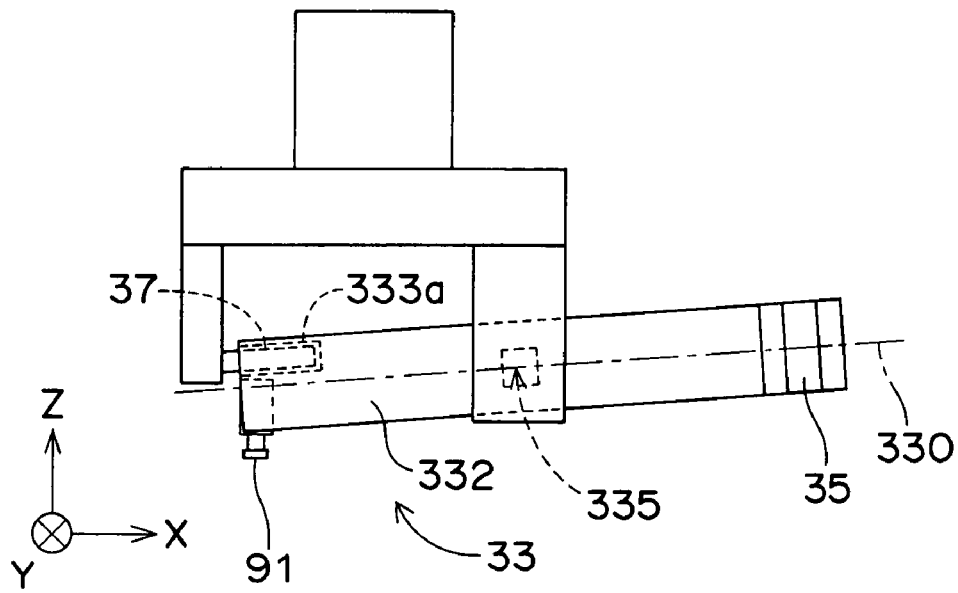
FIG. 8 is a front view showing another example of the electronic component mounting head.

FIGS. 3 and 4 are enlarged front view and left side view showing the electronic component mounting head 31. FIGS. 3 and 4 also show an electronic component 91 held by the electronic component mounting head 31 (so for FIGS. 6, 8, and 9). As shown in FIG. 3, the electronic component mounting head 31 includes a component holding unit 33 for holding the electronic component 91, an ultrasonic transducer 35 which is a transducer placed at an end portion on the (+X) side of the component holding unit 33 for applying ultrasonic vibrations to the electronic component 91 via the component holding unit 33, a supporter 36 to which the component holding unit 33 is attached, and an electrothermal heater 37 which is an example of the heating unit placed in a proximity to an end portion on the (−X) side of the component holding unit 33.

The electronic component mounting head 31 further includes, as shown in FIG. 4, a fiber-type radiation thermometer 38 for measuring the temperature of the electronic component 91 held by the component holding unit 33 in non-contact with the component holding unit 33 on the (+Y) side of the component holding unit 33. The radiation thermometer 38 is attached to the supporter 36 and is fixed relatively to the component holding unit 33. It is to be noted that in FIG. 3, the radiation thermometer 38 is omitted for easier understanding of the drawing.

As shown in FIG. 3, the supporter 36 has a holding-unit support member 361 for supporting the component holding unit 33 from the (+Y) side and the (−Y) side, and the holding-unit support member 361 is connected to the component holding unit 33 only at a nodal portion (i.e., knot portion) 335 of vibrations of the component holding unit 33 by the ultrasonic transducer 35.

The component holding unit 33 is an example of a pillar-shaped drive transmission member placed so as to extend roughly in the direction X, and includes a horn 332 to which the ultrasonic transducer 35 is attached, and a holding tool 331, which is removably attached to the end portion on the (−X) side of the horn 332, for sucking and holding the electronic component 91. The holding tool 331, which is formed from stainless steel having oscillation characteristics and vibration transmission characteristics preferable for mounting of the electronic component 91, has, in a central portion, a suction path for vacuum suction used for sucking and holding the electronic component 91.

A central axis 330 of the horn 332 in the generally square pole-shaped component holding unit 33 is placed so as to extend slightly upward on the (+Z) side as it goes toward the ultrasonic transducer 35 (i.e., toward the (+X) side). The vibrating direction of the component holding unit 33 by the ultrasonic transducer 35, i.e., the vibrating direction of the horn 332, is made parallel to the central axis 330. In other words, the horn 332 of the component holding unit 33 has a generally square pole shape extending in parallel to the direction of vibrations by the ultrasonic transducer 35. In the electronic component mounting apparatus 1 shown in FIG. 1, the principal surface of the circuit board 9 held by the board holding unit 2 is parallel to an XY plane, and therefore the vibrating direction of the component holding unit 33 is slightly inclined with respect to the principal surface of the circuit board 9. It is to be noted that in this first embodiment, the amplitude of vibrations of the component holding unit 33 by the ultrasonic transducer 35 is set to about 1 μm.

The component holding unit 33 shown in FIGS. 3 and 4 has a hole portion 333 that is a through hole formed to penetrate through the horn 332 in the direction Y (i.e., a through hole perpendicular to the direction of vibrations of the component holding unit 33 by the ultrasonic transducer 35), where a cross section perpendicular to a central axis 334 of the hole portion 333 is circular shaped. Moreover, the central axis 334 of the hole portion 333 perpendicularly intersects the central axis 330 of the component holding unit 33 as shown in FIG. 3.

A generally columnar heater 37 is inserted into the hole portion 333 with its central axis aligned with the central axis 334 of the hole portion 333. The heater 37 is supported by the heater support member 362 of the supporter 36 from both sides of the hole portion 333 (i.e., (+Y) side and (−Y) side), so that the heater 37 is fixed relatively to the supporter 36 in non-contact with the internal surface of the hole portion 333. The heater support member 362 is formed of a heat insulating member. Moreover, the heater 37 has a replaceable structure while the holding of the heater 37 by the heater support member 362 can be released.

In this first embodiment, the outside diameter of the heater 37 and the diameter of the hole portion 333 are set to, for example, 3.1 mm and 3.3 mm, respectively. That is, in the radial direction centered on the central axis 334 of the hole portion 333, a gap is provided between the surface of the heater 37 and the internal surface of the hole portion 333, and the gap is dimensioned to be 100 μm. In FIGS. 3 and 4, the pertinent distance is illustrated larger than the actual value as a matter of convenience for graphic display.

In the electronic component mounting head 31 shown in FIGS. 3 and 4, upon conduction of an electric current to the heater 37, radiant heat is applied from the heater 37 to the component holding unit 33 in the non-contact state, so that the electronic component 91 held by the holding tool 331 is heated via the component holding unit 33 (i.e., the horn 332 and the holding tool 331).

From a viewpoint of efficiently applying the radiant heat to the electronic component 91, it is desirable that the heater 37 and the component holding unit 33 should be close, and that a distance between the surface of the heater 37 and the internal surface of the hole portion 333 should be 100 µm or less. Also from a viewpoint of attaching the heater 37 without bringing the heater 37 into contact with the internal surface of the hole portion 333, it is desirable that the distance between the surface of the heater 37 and the internal surface of the hole portion 333 should be not less than a value obtained by adding amplitude (1 µm) of the ultrasonic vibrations of the component holding unit 33 to an upper limit (12 µm) of H7 in JIS (Japanese Industrial Standard) B0401 "Dimensional Tolerance and Fits" and further adding an allowance (1 µm) for the non-contact condition to the half (6.5 µm) of the obtained value, i.e., not less than 7.5 µm.

It is to be noted that when the heater 37 with different diameters is used, or when the amplitude of the component holding unit 33 is different, the diameter of the hole portion 333 and the distance between the surface of the heater 37 and the internal surface of the hole portion 333 should suitably be changed. Also in this case, the distance between the surface of the heater 37 and the internal surface of the hole portion 333 should preferably be not more than 100 µm, and not less than a value obtained by adding the amplitude of vibration of the component holding unit 33 to an upper limit of H7 in JIS (B0401) and further adding an allowances (1 µm) for the non-contact condition to the half of the obtained value.

As shown in FIGS. 1 and 2, the component feed unit 4 includes a component placement section 41 for mounting electronic components in predetermined positions, a feeder head 42 for taking out and retaining the electronic components from the component placement section 41, a feeder head moving device 43 for moving the feeder head 42 in the direction X, and a rotating device 44 for rotating and slightly moving the feeder head 42 upward and downward. The component placement section 41 includes a component tray 411 on which a number of electronic components are placed, a stage 412 for holding the component tray 411, and a tray moving device 413 for moving the component tray 411 in the direction X and the direction Y together with the stage 412.

As shown in FIG. 1, the feeder head 42 has a feeder collet 421 for feeding the electronic component held by vacuum pickup to the component holding unit 33 (see FIG. 3) of the electronic component mounting head 31. The feeder collet 421 has a suction path for vacuum suction in its central portion, and the electronic component is sucked and held by sucking from a suction opening formed at its top end.

In the component feed unit 4 shown in FIGS. 1 and 2, a number of electronic components scheduled to be mounted on the circuit board 9 are placed on the component tray 411 in such a way that the surfaces having electrodes to be bonded to the circuit board 9 being formed thereon (the undersides in the post-mounting state; hereinafter referred to as "bonding surfaces") face (+Z) side. Although the electrodes of the electronic component are protruding bumps formed with gold (Au) on electrode patterns in this first embodiment, the electrodes may be plated bumps and the like or may be electrode patterns itself, depending on mounting methods or electronic components to be mounted. The bumps may be provided on the electrodes of the circuit board 9 instead of being provided on the electrode patterns of the electronic component.

The image pickup unit 5 is provided at a position not interfering the movement of the electronic component mounting head 31, the position being on a migration pathway of the electronic component mounting head 31 (especially the component holding unit 33) moved by the mounting head moving device 32 (immediately beneath the migration path in the present embodiment), for picking up an image of the electronic component held by the component holding unit 33 from the (−Z) side. The component collecting device 61 provided between the board holding unit 2 and the image pickup unit 5 is also placed at a position not interfering with the movement of the electronic component mounting head 31, the position being on the migration pathway of the electronic component mounting head 31 (especially the component holding unit 33), for collecting the electronic component held by the component holding unit 33 where necessary. A component collecting device 62 attached to the (+X) side of the stage 412 is moved integrally with the stage 412 in the direction X and the direction Y by the tray moving device 413 for collecting the electronic component held by the feeder collet 421 where necessary.

Figure 5A:
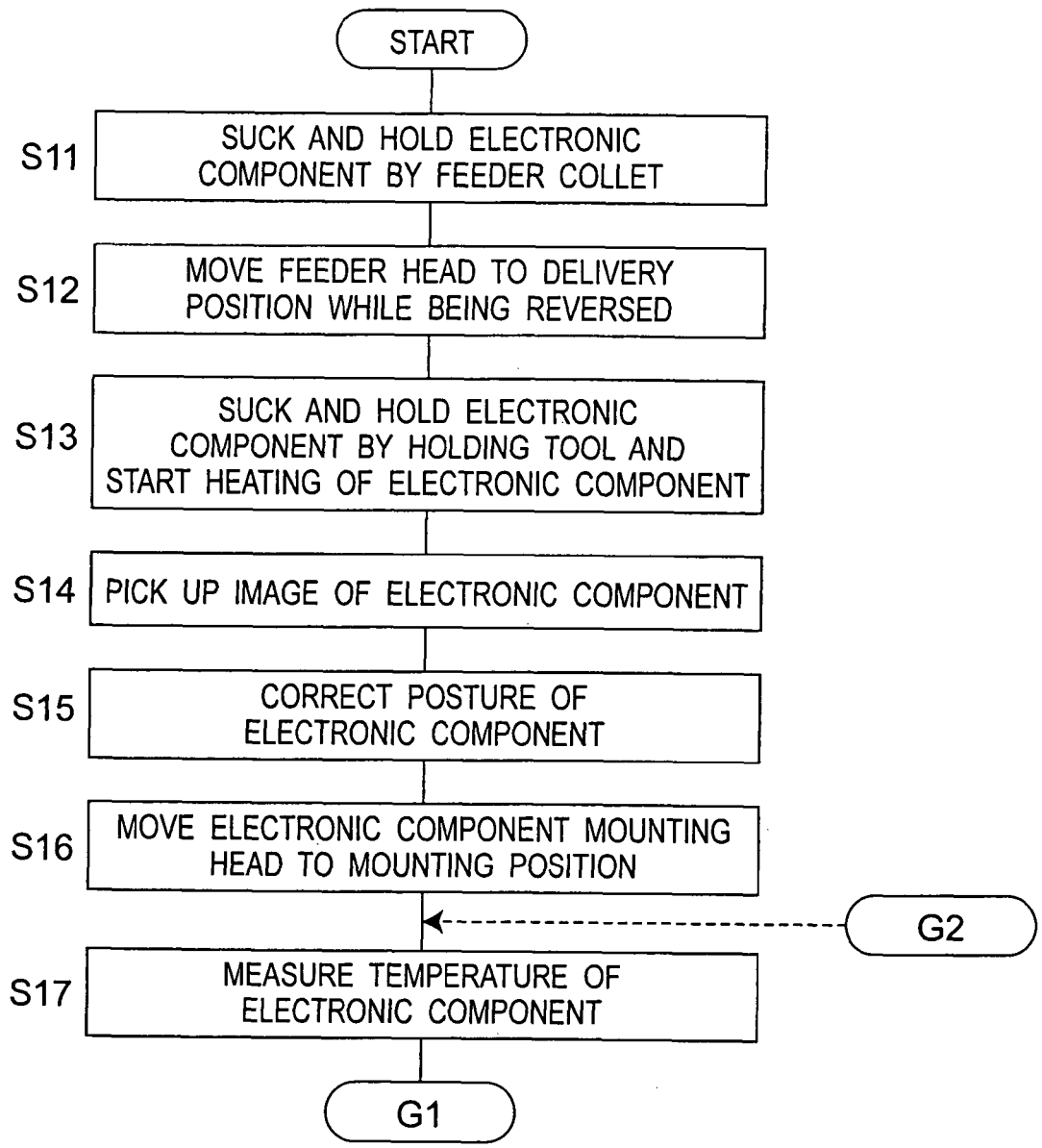
FIG. 5A is a flowchart showing the flow of mounting of electronic components.

FIGS. 5A and 5B are flowcharts showing the flow of mounting the electronic components by the electronic component mounting apparatus 1. It is to be noted that in FIGS. 5A and 5B, reference numeral $G_1$ and $G_2$ denote sequence between the flowcharts in the drawings. For mounting electronic components on the circuit board 9 by the electronic component mounting apparatus 1, first, the component tray 411 holding a number of electronic components with their bonding surfaces facing the (+Z) side is moved by the tray moving device 413 under the feeder head 42 which is positioned in advance on the (−X) side in FIG. 1, so that the bonding surface of an electronic component is sucked and held by the feeder collet 421 (step S11). Next, the feeder head 42, while being reversed, is moved in the direction (+X) by the feeder head moving device 43, and ends up being at a delivery position shown with a two-dot chain line in FIG. 1 (step S12). In the electronic component mounting apparatus 1, the electronic component mounting head 31 is positioned in advance at the delivery position shown with a two-dot chain line in FIG. 1, so that the feeder collet 421 and the holding tool 331 (see FIG. 3) of the electronic component mounting head 31 face each other.

Next, as the electronic component mounting head 31 is slightly moved downward by the up/down device 34, the top face of the electronic component is sucked and held by the component holding unit 33 while suction by the feeder collet 421 is stopped, and the component holding unit 33 receives the electronic component from the feeder collet 421 and sucks and holds it with the top end of the holding tool 331. In the electronic component mounting head 31 shown in FIG. 3, current has already conducted to the heater 37 to heat the component holding unit 33, and therefore, while the electronic component 91 is held by the component holding unit 33, heating of the electronic component 91 via the component holding unit 33 is started at the same time (step S13).

Once feeding of the electronic component 91 is completed, the electronic component mounting head 31 slightly goes up by the up/down device 34 shown in FIG. 1, and the feeder head 42 retreats to an original position. Concurrently with retreat of the feeder head 42, the electronic component mounting head 31 moves to right above the image pickup unit 5, which picks up an image of the electronic component 91 (see FIG. 3) held by the component holding unit 33 (step S14).

Image data which is an output from the image pickup unit 5 is sent to the control unit 10, where the acquired image data on the electronic component 91 and preinstalled image data on the electronic component 91 are collated to detect the posture of the electronic component 91 (i.e., the position and orientation of the electronic component 91). Then, based on a detection result, the posture of the electronic component 91 is corrected (step S15). If it is determined by the control unit 10 that the posture of the electronic component 91 cannot be corrected (i.e., sucking and holding error has occurred), then the mounting operation of the electronic component 91 is stopped, the electronic component mounting head 31 moves to the upper part of the component collecting device 61, and the electronic component 91 separated from the component holding unit 33 by blow of air from the component holding unit 33 and the like is collected by the component collecting device 61.

Next, the electronic component mounting head 31 is moved in the direction (+X) by the mounting head moving device 32, and ends up being at a position above a predetermined mounting position of the electronic component on the circuit board 9 (hereinafter referred to as a "mounting position") (step S16). In the electronic component mounting head 31, holding of the electronic component 91 and heating of the electronic component 91 in step S13 are continuously performed, and when the electronic component mounting head 31 is positioned at the mounting position, the temperature of the electronic component 91 is measured by a radiation thermometer 38 shown in FIG. 4 (step S17). An output from the radiation thermometer 38 is sent to the control unit 10 (see FIG. 1), where it is checked whether or not the temperature of the electronic component 91 is equal to a specified temperature (about 200° C. in this embodiment; hereinafter referred to as "set temperature") (step S18).

When the temperature of the electronic component is equal to the set temperature, then the electronic component mounting head 31 is moved downward to the circuit board 9 by the up/down device 34 shown in FIG. 1, and an electrode formed on the bonding surface of the electronic component 91 is brought into contact with an electrode on the circuit board 9. Then, the electronic component 91 is pressed by the up/down device 34 toward the circuit board 9, while ultrasonic vibrations are applied from the ultrasonic transducer 35 shown in FIG. 3 to the electronic component 91 via the component holding unit 33, i.e., the horn 332 and the holding tool 331. Thereby, the electronic component 91 is electrically bonded to the circuit board 9, so that electrical connecting and bonding of the electronic component 91 (i.e., mounting) are achieved simultaneously (step S19). Then, the electronic component mounting head 31 which stopped the suction of the electronic component 91 is separated from the electronic component 91 and is moved upward by the up/down device 34, by which the mounting of the electronic component 91 is completed. In the electronic component mounting apparatus 1, the up/down device 34 plays the role of a pressing device for pressing the electronic component 91 against the circuit board 9 via the electronic component mounting head 31 (i.e., the supporter 36 and the component holding unit 33).

If the temperature of the electronic component 91 differs from the set temperature due to an influence of disturbance and the like, (more specifically, if the temperature is out of the allowable range based on the set temperature), the mounting of the electronic components 91 is interrupted while an operator is notified of temperature anomaly by flashing of an alarm lamp and the like (step S181), and based on the output from the radiation thermometer 38, the output of the heater 37 (i.e., temperature of the heater 37) is adjusted by the control unit 10 (step S182). Then, the procedure returns to step S17, where the temperature of the electronic components 91 is again measured by the radiation thermometer 38 to check whether or not it is equal to the set temperature, and if the temperature of the electronic components 91 becomes equal to the set temperature, then mounting of the electronic components 91 is resumed (steps S17-S19). It is to be noted that the output of the heater 37 may be adjusted manually based on the result of a measurement of the radiation thermometer 38.

As explained above, in the electronic component mounting apparatus 1, the electronic component 91 is heated via the component holding unit 33 by the radiant heat from the heater 37 fixed in the noncontact state to the component holding unit 33. Therefore, the heater 37 can easily be attached to and detached from the component holding unit 33 without changing the characteristic of the ultrasonic vibrations applied to the electronic components 91 via the component holding unit 33. In other words, even if the electrothermal heater 37 is replaced, the characteristic of the ultrasonic vibrations applied to the electronic component 91 can be maintained constant. As a result, by replacing the heater 37 having a short life compared with other structures of the electronic component mounting head 31, the electronic component mounting head 31 can be used for a long period of time while maintaining high bonding reliability (i.e., quality of mounting) of the electronic component 91 to the circuit board 9. Moreover, using the electrothermal heater 37 for heating the electronic component 91 makes it possible to prevent the structure of the electronic component mounting head 31 and the electronic component mounting apparatus 1 from being complicated, and to suppress increase of apparatus costs.

In the electronic component mounting head 31 of the electronic component mounting apparatus 1, the circumference of the heater 37 is surrounded by the component holding unit 33 upon insertion of the heater 37 in the hole portion 333 of the component holding unit 33. Accordingly, the radiant heat from the heater 37 is efficiently applied to the component holding unit 33, so that efficient heating of the component holding unit 33 and the electronic component 91 can be achieved.

In the electronic component mounting head 31, the hole portion 333 is made as a through hole perpendicular to the vibrating direction of the component holding unit 33, so that the heater 37 can be fixed relatively to the component holding unit 33 without increasing the length of the electronic component mounting head 31 in the direction of the central-axis 330, making it possible to miniaturize the electronic component mounting head 31. Moreover, since the heater 37 can be placed in a proximity to the electronic component 91 without forming a hole portion in the holding tool 331, the electronic component 91 can be heated more efficiently without complicating the structure of the component holding unit 33. Further, since the heater 37 is supported from both the sides of the hole portion 333, the heater 37 can certainly be supported in non-contact with the component holding unit 33, so that the distance between the surface of the heater 37 and the internal surface of the hole portion 333 can be made smaller.

In the electronic component mounting head 31, the hole portion 333 with a circular cross section is formed in the component holding unit 33 with the central axis 334 perpendicularly intersecting the central axis 330 of the component holding unit 33, which makes it possible to prevent the mass of the component holding unit 33 from being biased to the upward or downward from the central axis 330 in the direction Z due to an influence of the hole portion 333, and makes it possible to reduce the influence of the hole portion 333 on the characteristic of the ultrasonic vibrations applied to the electronic component 91 via the component holding unit 33.

Moreover, as the supporter 36 for supporting the heater 37 supports the component holding unit 33 only at the nodal portion 335 of the vibration of the component holding unit 33 by the ultrasonic transducer 35, the heater is easily movable together with the component holding unit 33, while the influence of the supporter 36 on the characteristic of the ultrasonic vibrations applied to the electronic component 91 can be reduced. As a result, even when the component holding unit 33 needs to be attached to and detached from the supporter 36, it is not necessary to give excessive consideration to the influence of a slight difference during attachment on the vibration characteristic, which can facilitate attachment of the component holding unit 33 to the supporter 36.

In the electronic component mounting head 31, the ultrasonic transducer 35 is placed in an end portion of the component holding unit 33 opposite to the end portion where the heater 37 is placed, and more specifically, the ultrasonic transducer 35 is placed as far away from the heater 37 as possible in order to suppress conduction of the heat from the heater 37 to the ultrasonic transducer 35 having relatively low heat resistant temperature compared with the electronic component 91. As a result, the electronic component 91 can be heated to the set temperature, while the temperature of the ultrasonic transducer 35 can be maintained below the heat resistant temperature (about 60° C. in this first embodiment).

In the electronic component mounting apparatus 1, the temperature of the electronic component 91 is measured with the radiation thermometer 38 in non-contact with the component holding unit 33, so that the temperature of the electronic component 91 can be acquired correctly without affecting the characteristic of the ultrasonic vibrations applied to the electronic component 91. Moreover, since the temperature of the electronic component 91 can be maintained at the set temperature by automatic adjustment of the output of the heater 37 by the control unit 10 based on the result of a measurement by the radiation thermometer 38, the quality of mounting of the electronic component 91 can be enhanced more.

Second Embodiment

Figure 6:
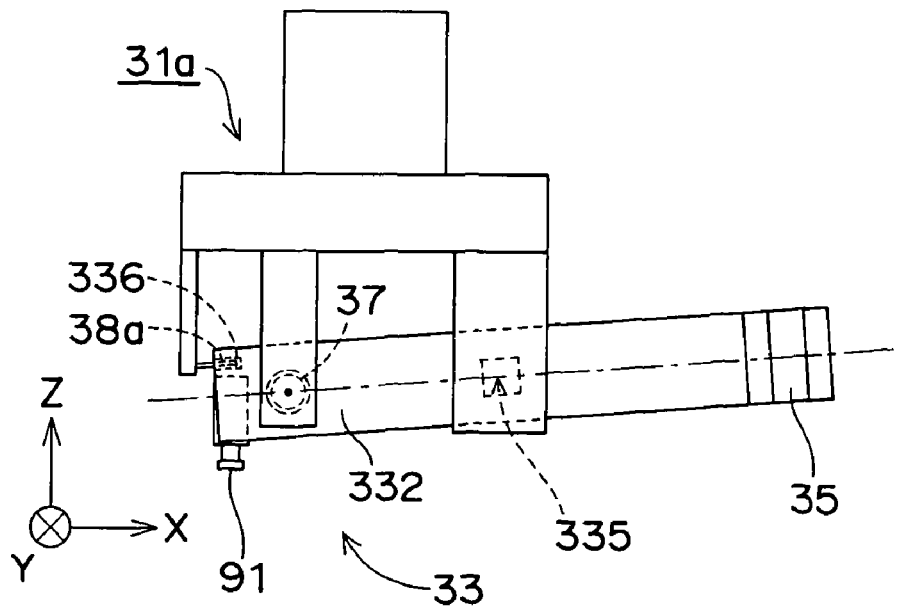
FIG. 6 is an enlarged front view showing an electronic component mounting head according to a second embodiment of the invention.

Description is now given of an electronic component mounting apparatus in a second embodiment of the present invention. FIG. 6 is an enlarged front view showing an electronic component mounting head 31a of the electronic component mounting apparatus in the second embodiment. As shown in FIG. 6, the electronic component mounting head 31a has a thermocouple 38a which is a thermometer for measuring the temperature of the component holding unit 33 instead of the radiation thermometer 38. The thermocouple 38a is inserted in a recess portion 336 which is a hole portion formed in an end portion on the (−X) side of the horn 332 in the component holding unit 33, and measures the temperature of the component holding unit in non-contact with the component holding unit 33. Other structures are similar to those in FIG. 1 or 4, so that similar reference numeral is used in the following description.

Figure 7:
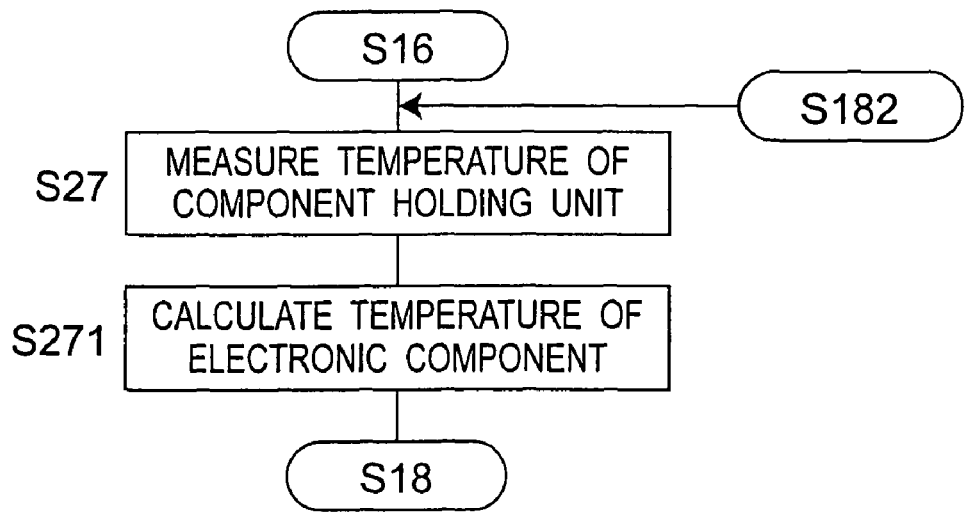
FIG. 7 is a flowchart showing a part of the flow of mounting of electronic components.

The flow of mounting of the electronic component in the electronic component mounting apparatus in the second embodiment is generally identical to that in the first embodiment except for the point that the temperature of the component holding unit 33 is measured in place of the temperature of the electronic component 91. FIG. 7 is a flowchart showing a part of the flow of mounting of the electronic component 91 in the electronic component mounting apparatus in the second embodiment, in which the steps before and after the steps S27 and S271 shown in FIG. 7 are identical to steps S11-S16, and S18, S19, S181 and S182 shown in FIGS. 5A and 5B, respectively.

For mounting the electronic component 91 on the circuit board 9 (see FIG. 1) by the electronic component mounting apparatus in the second embodiment, first, the above-mentioned steps S11-S16 are performed, and the electronic component mounting head 31a for holding the electronic component 91 is positioned at the mounting position. Next, the temperature of the component holding unit 33 is measured by the thermocouple 38a and is sent to the control unit 10 (see FIG. 1) (FIG. 7: step S27). The control unit 10, in which information indicating the relation between preparatorily determined temperatures of the component holding unit 33 and temperatures of the electronic component 91 has been stored, computes the temperature of the electronic component 91 based on the information and the output from the thermocouple 38a (step S271).

Then, after it is confirmed, as in the first embodiment, that the temperature of the electronic component 91 is equal to the set temperature, the electronic component 91 is mounted on the circuit board 9 (step S18, S19). If the temperature of the electronic component 91 differs from the set temperature, notification to an operator and output adjustment of the heater 37 (step S181, S182) are performed before the procedure returns to step S27, where the temperature of the component holding unit 33 is measured again.

As explained above, in the electronic component mounting apparatus in the second embodiment, as in the first embodiment, the electronic component 91 is heated via the component holding unit 33 by the radiant heat from the heater 37 fixed in the non-contact state to the component holding unit 33. Accordingly, in the case of performing ultrasonic bonding of the electronic component 91 to the circuit board 9 while heating the electronic component 91, the characteristics of ultrasonic vibrations applied to the electronic component 91 can be maintained constant even with replacement of the electrothermal heater 37. Moreover, the temperature of the component holding unit 33 is measured with the thermocouple 38a in non-contact with the component holding unit 33 to obtain the temperature of the electronic component 91, so that the temperature of the electronic component 91 can be acquired correctly without affecting the characteristic of the ultrasonic vibrations applied to the electronic component 91.

In the electronic component mounting apparatus in the second embodiment, when flexible wire type thermocouples, sheathed thermocouples and the like are used as the thermocouple 38a, the thermocouple 38a may be fixed to the component holding unit 33 in the state of being in contact with the internal surface of the recess portion 336. Accordingly, almost without affecting the characteristic of the ultrasonic vibrations applied to the electronic component 91, the temperature of the component holding unit can be acquired more correctly compared with the noncontact type measurement by the thermocouple 38a, and so more correct temperature of the electronic component 91 can be acquired. Moreover, the thermocouple 38a may be inserted in a groove portion formed in the internal surface of the hole portion 333 of the component holding unit 33 which receives the heater 37.

While specific embodiments the present invention have been described above, it should be understood that the present invention is not limited to the embodiments disclosed and various modifications are possible.

In the electronic component mounting head of the electronic component mounting apparatus in the disclosed embodiment, the cross section of the hole portion 333 for receiving the heater 37 is not necessarily limited to a circular shape. From a viewpoint of reducing the influence of the hole portion 333 on the characteristic of the ultrasonic vibrations applied to the electronic component 91, the central axis 334 of the hole portion 333 should just perpendicularly intersect the central axis 330 of the component holding unit 33, and the hole portion 333 should just be in plane symmetry with the surface including both the central axes 330, 334 (i.e., the surface including the entire central axis 330 and extending at right angles with the page in FIG. 3). Therefore, the cross section of the hole portion 333 may be formed into, for example, an ellipse long in the vibrating direction of the component holding unit 33. In this case, since the distance between the surface of the heater 37 and the hole portion 333 is increased in the vibrating direction of the component holding unit 33, the contact between the heater 37 and the internal surface of the hole portion 333 is prevented with more certainty. The hole portion 333 should preferably be also in plane symmetry with the surface parallel to XZ plane including the central axis 330 in FIG. 3 (i.e., the surface including the central axis 330 and perpendicular to the circuit board 9 (see FIG. 1)).

From a viewpoint of ensuring support of the heater 37 in non-contact with the component holding unit 33, the heater 37 should preferably be held from both the sides of the hole portion 333. However, when there is any structural constraint of the apparatus or others, the heater 37 may be held by only one of the (+Y) side and the (−Y) side of the hole portion 333 where necessary.

In the electronic component mounting head, the hole portion 333 for receiving the heater 37 is a through hole perpendicular to the vibrating direction of the component holding unit 33. However, as shown in the front view of FIG. 8 for example, a recess portion having a central axis parallel to the vibrating direction (i.e., the direction of the central axis 330 of component holding unit 33) of the component holding unit 33 by the ultrasonic transducer 35 may be formed in an end portion on the (−X) side of the horn 332 in the component holding unit 33 as the hole portion 333a. Also in this case, radiant heat is given from a generally columnar heater 37 inserted in the hole portion 333a with a circular cross section in non-contact with the component holding unit 33, ultrasonic bonding of the electronic component 91 to the circuit board can be achieved while the electronic component 91 is heated via the component holding unit 33 without changing the characteristic of the ultrasonic vibrations applied to the electronic component 91.

Figure 9:
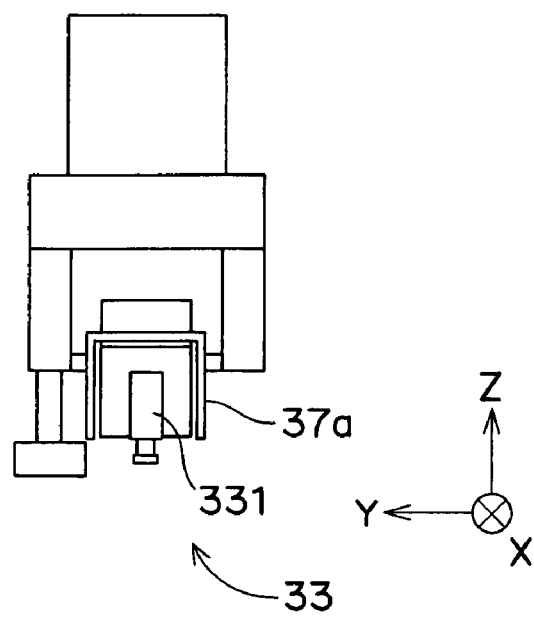
FIG. 9 is a left side view showing still another example of the electronic component mounting head.

Moreover, the heater 37 does not necessarily have to be inserted in the hole portion 333 formed in the component holding unit 33, and in the electronic component mounting head, as shown in the left side view of FIG. 9 for example, a so-called gate type heater 37a surrounding the (+Y) side, the (−Y) side and the (+Z) side of the component holding unit 33 may be provided in the vicinity of the end portion on the (−X) side of the component holding unit 33 (i.e., in the vicinity of the holding tool 331).

In the electronic component mounting head according to the first and second embodiments, the component holding unit 33 does not necessarily have to be structured so that the holding tool 331 is removably attached to the horn 332, but a component holding unit in which the holding tool and the horn were integrally formed may be attached to the supporter 36.

In the electronic component mounting apparatus, holding of the electronic component by the holding tool may not be limited to suction and holding by vacuum, but may be through electric or magnetic pickup.

Moreover, although description has been given of the case where an electrothermal heater is used as an example of the heating unit, the heating unit is not limited only to such a heater. The heating unit may be embodied by any device as long as it has a function to perform heating by a non-contact method, and devices such as lamp heaters, electromagnetic-induction (IH) heating devices and hot air heaters can be applied. In the case where devices other than the electrothermal heater are adopted as the heating unit, it is desirable to adjust the attachment position of the heating unit, the shape and the placement of the hole portion 333 formed in the horn 332 and the like in conformity with the shape and the function of the heating unit.

The electronic component mounting apparatus is suitable for mounting semiconductor light emitting devices such as light emitting diodes and semiconductor lasers, and it is also suitable for mounting various kinds of electronic components other than the semiconductor light emitting devices, such as semi-conductor bare chip components and SAW (Surface Acoustic Wave) filters.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-129991 filed on May 9, 2006, including specification, drawings and claims are incorporated herein by reference in its entirety.

INDUSTRIAL APPLICABILITY

The present invention is applicable to various technologies for mounting electronic components on a circuit board with use of ultrasonic waves.

The invention claimed is:

1. An electronic component mounting apparatus for mounting an electronic component onto a circuit board using an ultrasonic wave, the apparatus comprising:
   a component holding unit for holding the electronic component;
   a supporter to which the component holding unit is attached;
   a heating unit, which is fixed to the supporter in non-contact state with the component holding unit, for applying radiant heat so as to heat the electronic component in a state of being held by the component holding unit;
   an ultrasonic transducer for applying ultrasonic vibrations to the electronic component via the component holding unit; and
   a pressing device for pressing the electronic component toward the circuit board via the supporter and the component holding unit,
   wherein the component holding unit has a hole portion into which the heating unit is inserted, wherein the heating unit is held by the supporter in a state of being inserted in the hole portion without coming into contact with an inner surface of the hole portion, wherein the hole portion is a through hole formed in a direction perpendicular to a direction of vibrations of the component holding unit by the ultrasonic transducer, and wherein the heating unit is held by the supporter from both sides of the through hole.

2. The electronic component mounting apparatus according to claim 1, wherein the heating unit is an electrothermal heater, and wherein a gap of not less than 7.5 μm and not more than 100 μm is provided between a surface of the heater and an inner surface of the hole portion.

3. The electronic component mounting apparatus according to claim 1, wherein the supporter supports the component holding unit only at a nodal portion of vibrations of the component holding unit by the ultrasonic transducer.

4. The electronic component mounting apparatus according to claim 1, further comprising a thermometer for measuring temperature of the component holding unit or temperature of the electronic component held by the component holding unit, the thermometer being arranged in a non-contact state with the component holding unit.

5. The electronic component mounting apparatus according to claim 1, further comprising a thermocouple, which is inserted into a hole portion formed in the component holding unit, for measuring temperature of the component holding unit, the thermocouple being arranged in a non-contact state with the component holding unit.

6. An electronic component mounting apparatus for mounting an electronic component onto a circuit board using an ultrasonic wave, the apparatus comprising:
   a component holding unit for holding the electronic component;
   a supporter to which the component holding unit is attached;
   a heating unit, which is fixed to the supporter in non-contact state with the component holding unit, for applying radiant heat so as to heat the electronic component in a state of being held by the component holding unit;
   an ultrasonic transducer for applying ultrasonic vibrations to the electronic component via the component holding unit; and
   a pressing device for pressing the electronic component toward the circuit board via the supporter and the component holding unit,
   wherein the component holding unit has a hole portion into which the heating unit is inserted,
   wherein the heating unit is held by the supporter in a state of being inserted in the hole portion without coming into contact with an inner surface of the hole portion,
   wherein the component holding unit comprises a vibration transmitting member and a holding tool, the vibration transmitting member having the hole portion formed therein and being arranged so as to extend in parallel to the direction of vibrations of the component holding unit by the ultrasonic transducer, and the holding tool being attached to one end of the vibration transmitting member for holding the electronic component, and
   wherein a central axis of the hole portion in the vibration transmitting member is arranged so as to perpendicularly intersect a central axis of the vibration transmitting member, and the hole portion is arranged so as to be in plane symmetry with a plane including the central axis of the hole portion and the central axis of the vibration transmitting member.

7. The electronic component mounting apparatus according to claim 6, wherein the heating unit is an electrothermal heater, and
   wherein a gap of not less than 7.5 μm and not more than 100 μm is provided between a surface of the heater and an inner surface of the hole portion.

8. The electronic component mounting apparatus according to claim 6, wherein the supporter supports the component holding unit only at a nodal portion of vibrations of the component holding unit by the ultrasonic transducer.

9. The electronic component mounting apparatus according to claim 6, further comprising a thermometer for measuring temperature of the component holding unit or temperature of the electronic component held by the component holding unit, the thermometer being arranged in a non-contact state with the component holding unit.

10. The electronic component mounting apparatus according to claim 6, further comprising a thermocouple, which is inserted into a hole portion formed in the component holding unit, for measuring temperature of the component holding unit, the thermocouple being arranged in a non-contact state with the component holding unit.

11. An electronic component mounting apparatus for mounting an electronic component onto a circuit board using an ultrasonic wave, the apparatus comprising:
    a component holding unit for holding the electronic component;
    a supporter to which the component holding unit is attached;
    a heating unit, which is fixed to the supporter in non-contact state with the component holding unit, for applying radiant heat so as to heat the electronic component in a state of being held by the component holding unit;
    an ultrasonic transducer for applying ultrasonic vibrations to the electronic component via the component holding unit; and
    a pressing device for pressing the electronic component toward the circuit board via the supporter and the component holding unit,
    wherein the component holding unit has a hole portion into which the heating unit is inserted,
    wherein the heating unit is held by the supporter in a state of being inserted in the hole portion without coming into contact with an inner surface of the hole portion,
    wherein the component holding unit comprises a vibration transmitting member and a holding tool, the vibration transmitting member having the hole portion formed therein and being arranged so as to extend in parallel to a direction of vibrations of the component holding unit by the ultrasonic transducer, the heating unit being inserted in the hole portion and the ultrasonic transducer being attached at one end portion of the vibration transmitting member, and the holding tool being attached to the other end of the vibration transmitting member for holding the electronic component, and
    wherein the hole portion and the heating unit are placed in a proximity of the other end of the vibration transmitting member at which the holding tool is attached.

12. The electronic component mounting apparatus according to claim 11, wherein the heating unit is an electrothermal heater, and
    wherein a gap of not less than 7.5 μm and not more than 100 μm is provided between a surface of the heater and an inner surface of the hole portion.

13. The electronic component mounting apparatus according to claim 11, wherein the supporter supports the component holding unit only at a nodal portion of vibrations of the component holding unit by the ultrasonic transducer.

14. The electronic component mounting apparatus according to claim 11, further comprising a thermometer for measuring temperature of the component holding unit or temperature of an electronic component held by the component holding unit, the thermometer being arranged in a non-contact state with the component holding unit.

15. The electronic component mounting apparatus according to claim 11, further comprising a thermocouple, which is inserted into a hole portion formed in the component holding unit, for measuring temperature of the component holding unit, the thermocouple being arranged in a non-contact with the component holding unit.

16. An electronic component mounting head for use in an electronic component mounting apparatus for mounting an electronic component onto a circuit board with use of an ultrasonic wave, the electronic component mounting head comprising:
   a component holding unit for holding the electronic component;
   a supporter to which the component holding unit is attached;
   a heating unit, which is fixed to the supporter in non-contact state with the component holding unit, for applying radiant heat so as to heat the electronic component in a state of being held by the component holding unit; and
   an ultrasonic transducer for applying ultrasonic vibrations to the electronic component via the component holding unit,
   wherein the component holding unit has a hole portion into which the heating unit is inserted,
   wherein the heating unit is held by the supporter in a state of being inserted in the hole portion without coming into contact with an inner surface of the hole portion,
   wherein the component holding unit comprises a vibration transmitting member and a holding tool, the vibration transmitting member having the hole portion formed therein and being arranged so as to extend in parallel to a direction of vibrations of the component holding unit by the ultrasonic transducer, the heating unit being inserted in the hole portion and the ultrasonic transducer being attached at one end portion of the vibration transmitting member, and the holding tool being attached to the other end of the vibration transmitting member for holding the electronic component, and
   wherein the hole portion and the heating unit are placed in a proximity of the other end of the vibration transmitting member at which the holding tool is attached.

\* \* \* \* \*

UNITED STATES PATENT AND TRADEMARK OFFICE
CERTIFICATE OF CORRECTION

PATENT NO.        : 7,980,444 B2                              Page 1 of 1
APPLICATION NO.   : 11/887740
DATED             : July 19, 2011
INVENTOR(S)       : Hiroshi Ebihara et al.

It is certified that error appears in the above-identified patent and that said Letters Patent is hereby corrected as shown below:

Title Page, Item (56) References Cited, under the "OTHER PUBLICATIONS" heading, please insert the following document:
  -- Chinese Office Action (in English language) issued March 10, 2010 in corresponding Chinese Patent Application No. 200780000149.8. --

Signed and Sealed this
Tenth Day of January, 2012

David J. Kappos
*Director of the United States Patent and Trademark Office*